United States Patent
Beach et al.

(10) Patent No.: US 7,330,025 B1
(45) Date of Patent: Feb. 12, 2008

(54) TOUCHDOWN COUNTER FOR INTEGRATED CIRCUIT TESTERS

(75) Inventors: Ronald M. Beach, Pleasanton, CA (US); James Stephen Paine, San Jose, CA (US); Joseph W. Foerstel, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 92 days.

(21) Appl. No.: 11/286,250

(22) Filed: Nov. 23, 2005

(51) Int. Cl.
*G01R 31/28* (2006.01)
(52) U.S. Cl. .................................. 324/158.1
(58) Field of Classification Search ............ None
See application file for complete search history.

(56) References Cited

U.S. PATENT DOCUMENTS

| | | | |
|---|---|---|---|
| 5,184,068 A | 2/1993 | Twigg et al. | |
| 5,596,283 A * | 1/1997 | Mellitz et al. | 324/754 |
| 6,096,567 A * | 8/2000 | Kaplan et al. | 438/14 |
| 6,359,455 B1 | 3/2002 | Takekoshi | |
| 6,415,397 B1 | 7/2002 | Co et al. | |
| 6,426,904 B2 | 7/2002 | Barth et al. | |
| 6,828,810 B2 | 12/2004 | Kanamaru et al. | |
| 6,894,523 B2 | 5/2005 | Neeb | |

* cited by examiner

*Primary Examiner*—Ha Tran Nguyen
*Assistant Examiner*—Trung Q. Nguyen
(74) *Attorney, Agent, or Firm*—G. Victor Treyz

(57) ABSTRACT

A touch-down counter is provided that maintains a count of how many times integrated circuits are placed into contact with a contactor in a test handler. The test handler has a work press that places integrated circuits into contact with pogo pins in the contactor. The pins are subject to wear and should be maintained by periodic cleaning. The touch-down counter has a sensor such as a non-contact Hall effect sensor that is attached to the contactor. A magnet is affixed to the side of the work press. When the work press comes into the vicinity of the sensor, the sensor detects the presence of the magnet and registers a contactor touch-down event. A lifetime count of touch-down events may be displayed on the counter. When a recommended threshold value of touch-down events has been exceeded, a test system operator can remove the contactor from use for cleaning.

16 Claims, 13 Drawing Sheets

TOUCHDOWN COUNTER FOR INTEGRATED CIRCUIT TESTERS

BACKGROUND

This invention relates to testing integrated circuits.

Integrated circuit manufacturing operations involve testing. Testing may be performed while integrated circuits are in wafer form or after individual die have been packaged. For example, tests may be performed on packaged die to investigate circuit performance under various environmental conditions.

In a typical test, trays of integrated circuits are loaded into a test handler. The trays may be, for example, trays that conform to Joint Electron Device Engineering Council (JEDEC) standards. The test hander contains a computer-controlled arm called a work press. The work press picks up the integrated circuits from the trays and presses them into electrical contact with an array of pins in a test fixture called a contactor for testing. The operation of pressing an integrated circuit into contact with the contactor is referred to as a touch down, because the integrated circuit touches the pins in the contactor.

The pins in the contactor are typically pogo pins that extend and retract to accommodate each new integrated circuit being tested. The process of using the pogo pins creates wear and debris. Unless the contactor is maintained properly, some of the pins may fail to provide adequate contact during a test.

Waiting for a contactor to fail during testing before performing maintenance is generally undesirable. Proper contactor maintenance therefore requires scheduling. In a typical scenario, test operators are asked to maintain log books in which they manually record how often each contactor is used during a test run. Serial numbers are printed on the sides of contactors for identification.

This type of manual record keeping process is prone to error. Operators often forget to make log book entries or make incorrect entries. Contactors are often transferred between different test environments, which imposes further burdens. If a contactor is transferred from one worksite to another, it may be difficult or impossible to properly transfer the log book and records that are associated with the contactor.

Proper maintenance of log book records is also complicated by the fact that it is sometimes necessary to abort a test run. When a run is aborted, the test handler is flushed. All integrated circuits in the handler during the flush process are run through the contactor, even though they are not tested. Because flushing the handler creates additional touch-down events but does not complete any tests, operators can become confused as to whether or not to record the touch-downs. Operators can also become confused when performing test preparation operations that involve running dummy units through the test handler, because contactor touch-down events take place without any related testing.

Because of these factors, it is difficult to maintain adequate usage records and contactors are sometimes not maintained properly. This can lead to corrupted test results and downtime on the test floor.

It would therefore be desirable to be able to provide improved techniques for gathering information on how often a given contactor is used.

SUMMARY

In accordance with the present invention, a touch-down counter is provided that counts how many times integrated circuits are placed in contact with an array of test pins. The array of test pins may be attached to a probe head in a wafer tester or may be part of a contactor in a test system used to test packaged integrated circuits.

With one suitable arrangement, a test handler is used to test trays of integrated circuits. The test handler has a robotic work press that places integrated circuits into contact with a contactor. The contactor contains an array of pogo pins that are compressed each time the work press places an new integrated circuit into contact with the contactor.

To maintain a count of the number of touch-downs on the contactor and its pins, the touch-down counter automatically monitors each touch-down event. The touch-down counter may use a contact sensor or a non-contact sensor to detect touch-down events. Suitable non-contact sensors include capacitive proximity sensors and Hall-effect sensors.

The contactor may have a floating plate inner region and an outer region. A Hall-effect sensor may be permanently attached to the outer region of a given contactor. A cable may be used to permanently attach the sensor to a display unit. The display unit contains display driver and counting circuitry.

A magnet may be mounted on the end of the work press. Each time the work press places an integrated circuit into contact with the contactor, the magnet is brought within range of the Hall-effect sensor. Each time the Hall-effect sensor detects the presence of the magnet on the work press, the Hall-effect sensor generates a corresponding pulse indicating that a touch-down event has occurred.

Circuitry within the display unit receives the pulses from the Hall-effect sensor over the cable. Each time a pulse is received, a touch-down count value is incremented and a correspondingly updated touch-down count is displayed on the display unit. The display unit may be mounted to the test handler using a non-permanent fastener. When it is desired to transfer the contactor to a new test environment, the permanent connection between the counter and the contactor ensures that the counter will not be lost and will remain associated with the contactor, whereas the non-permanent attachment used for the display allows the display to be removed from the test handler. This allows the contactor and counter to be transferred between different test handlers, signal routing cards, and organizations without disturbing the touch-down count maintained by the counter.

Further features of the invention, its nature and various advantages will be more apparent from the accompanying drawings and the following detailed description of the preferred embodiments.

DETAILED DESCRIPTION

The present invention relates to testing integrated circuits. Tests may be performed while integrated circuits are in wafer form or after integrated circuits have been packaged.

Figure 1:
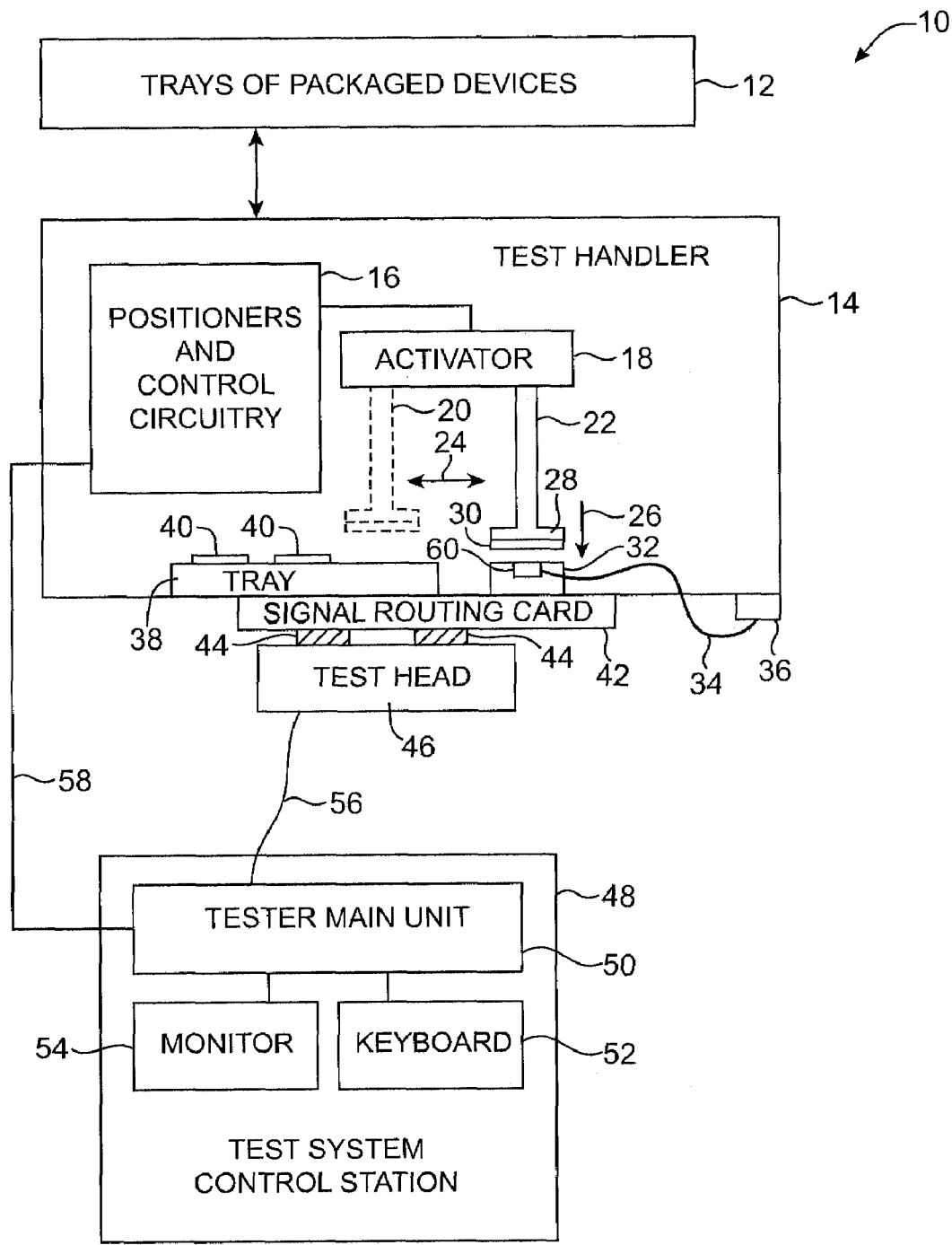
FIG. 1 is a schematic diagram of a test system using a contactor touch-down counter in accordance with the present invention.

An illustrative test system 10 that may be used to test packaged integrated circuits is shown in FIG. 1. Packaged integrated circuits are typically received on the test floor in stacks of trays 12. Each tray contains an array of packaged integrated circuits. To test the integrated circuits, a test system operator loads the stack of trays into a test handler 14.

The test handler 14 is a robotic positioning system that manipulates the trays 12 and the packaged integrated circuits in the trays so that tests can be performed. Test handler 14 preferably includes positioners and control circuitry 16 for moving the trays 12 from a test handler loading bay to the vicinity of contactor 32. Contactor 32 contains an array of pins that form electrical contacts with corresponding contact regions on each integrated circuit that is tested. The contacts on packaged integrated circuits may be formed from pins, pads, solder balls, or any other suitable electrically conductive structures.

In the drawing of FIG. 1, a tray 38 of packaged integrated circuits 40 is shown as having been positioned adjacent to contactor 32. An actuator such as actuator 18 is used to maneuver an arm 22. The arm 22 has a vacuum head 28 that picks up integrated circuits from tray 38 and presses them into intimate contact with the contactor 32. The dotted line outline 20 in FIG. 1 shows the position of arm 22 when picking up an integrated circuit from tray 38. As shown by arrow 24, the arm moves between a position such as position 20 over the tray 38 to the position shown by arm 22 in FIG. 1, which is over the contactor 32. After reaching the position shown in FIG. 1, arm 22 extends downward in direction 26 and presses integrated circuit 30 against the pins in contactor 32. The arm 22 and head 28 are typically referred to as the "work press" of the test handler.

Each time the work press places an integrated circuit into physical and electrical contact with the pins of contactor 32, the pins of the contactor 32 suffer wear. Each contact between the circuit and the contactor pins is referred to as a "touch down." In accordance with the present invention, a counter is provided that counts the number of touch downs experienced by the contactor 32. With one suitable arrangement, the counter has a sensor 60 that is attached to a display unit 36 via a cable 34. Each time the sensor 60 detects the presence of the head 28 of the work press, the count displayed on display 36 is incremented by one. An advantage of the illustrative counter arrangement of FIG. 1 is that the display 36 can be mounted to the handler 14 in a position that can be easily viewed by the test system operator.

Contactors such as contactor 32 are mounted on signal routing cards such as signal routing card 42. Signal routing cards, which are sometimes referred to as device-under-test cards (DUT cards) or load cards, form an electrical interface between contactors and test heads. In the example of FIG. 1, a test head 46 is connected to the lower portion of signal routing card 42 using connectors 44. The contactor 32 is connected to the upper portion of the signal routing card 42 using screws. When contactor 32 is screwed into place on the top of the signal routing card 42, the pins in the contactor form electrical contacts with an array of mating contact pads on the upper surface of the signal routing card 42.

Test head 46 routes signals between signals routing card 42 and the main unit 50 of test system control station 48 over cable 56. Tester main unit 50 is also preferably connected to the control circuitry 16 of test handler 14 using path 58. The test system control station 48 has a monitor 54 and keyboard 52 to allow the operator of the test system 10 to interact with the tester main unit 50. The operator can direct tester main unit 50 to perform various tests and can control the processing of the integrated circuits that are being tested using test handler 14.

Figure 2:
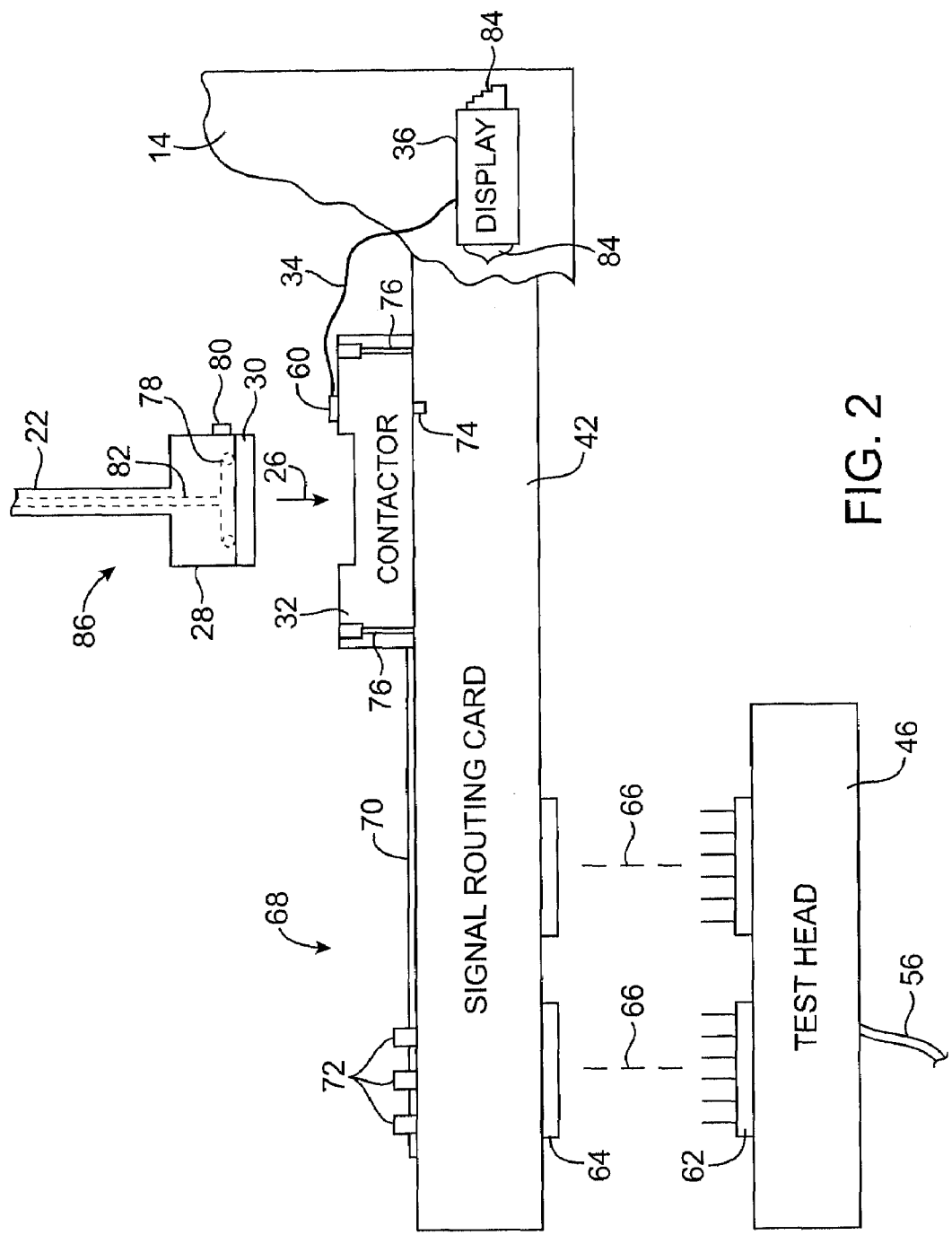
FIG. 2 is a side view of a portion of a test system using a contactor touch-down counter in accordance with the present invention.

FIG. 2 shows an illustrative side view of a portion of the test system 10 of FIG. 2. As shown in FIG. 2, test head 46 is connected to signal routing card 42 using pin connectors 62 and socket connectors 64. Dotted lines 66 indicate how the pin-and-socket connectors mate when test head 46 is mounted to signal routing card 42.

Signal routing card 42 contains circuitry 68 that electrically connects contactor 32 to connectors 64. Circuitry 68 includes passive conductive paths such as traces 70 and capacitors and other circuit components 72.

Contactor 32 is attached to signal routing card 42 using screws 76. Contactor 32 has two registration pins such as registration pin 74. The registration pins protrude from the lower surface of contactor 32. Signal routing card 42 has two corresponding registration holes. When contactor 32 is installed on signal routing card 42, the registration pins 74 fit into the holes in the signal routing card 42. The two registration pins are formed on two adjacent edges of the contactor 32, so there is only one possible rotational orientation in which to mount contactor 32 to card 42.

The head 28 of work press 86 preferably has a mechanism for holding integrated circuit 30. With one suitable arrangement, the work press 86 contains an o-ring 78 and has an internal vacuum passageway 82 that supplies a vacuum to the upper surface of integrated circuit 30. When a vacuum is applied by the handler, integrated circuit 30 is held in place against the lower surface of head 28. Testing is performed by advancing the integrated circuit in direction 26 until the lower surface of the integrated circuit is pressed into contact with contactor 32. After the integrated circuit has been tested, the vacuum can be released, so that integrated circuit can be returned to its tray in the handler.

Sensor 60 senses each touch down of integrated circuit 30 against contactor 32. Sensor 60 may be a contact sensor such as a mechanical or electrical switch that makes physical contact with a structure such as work press 86 or may be a non-contact sensor such as a capacitive proximity sensor or a Hall-effect sensor. An advantage of using a non-contact sensor such as a Hall-effect sensor or capacitive proximity sensor is that these sensors have no moving parts, so wear is negligible.

In configurations in which sensor 60 is a Hall-effect sensor, a magnet 80 is mounted to the side of the head 28 of the work press 86. Any suitable magnet type may be used (e.g., neodymium). Magnet 80 may be any suitable size and shape for attaching to the end of work press 86. As an example, magnet 80 may be about 2 mm×2 mm×1 mm in size and may be affixed to work press 86 using cyanoacrylate glue or other suitable adhesive. Sensor 60 may be a sensor such as Hall-effect sensor Part No. A3212 available from Allegro Microsystems, Inc. of Worcester, Mass. Typical dimensions for a sensor 60 are about 5 mm×3 mm×1 mm. Sensor 60 and magnet 80 are preferably mounted so that they are separated by less than the maximum sensor range of sensor 60 when work press 86 is extended and rests adjacent to contactor 32. The sensor range of the illustrative A3212 Hall-effect sensor is about 200 mils, so if this type of part is used for sensor 60, sensor 60 and magnet 80 are preferably attached to the test system so that their minimum lateral separation is less than 200 mils. Sensor 60 may be attached to contactor 32 using cyanoacrylate glue or other suitable adhesive.

Signals from sensor 60 are conveyed to processing and display components in the counter such as display 36 over a cable 34. The length of cable 34 is preferably sufficiently long to allow display 36 to be mounted in a readily visible location on the test handler 14. In the example of FIG. 2, the display is shown as being mounted to a portion of the handler 14 using a hook-and-loop fastener 84 such as Velcro® hook-and-loop fastener. One portion of fastener 84 (e.g., the hook portion) is attached to display 36 the other portion of fastener 84 (e.g., the loop portion) is attached to handler 14. With a non-permanent fastener of this type, display 36 and other portions of the contactor touch-down counter can remain associated with a given contactor 32 when that contactor is transferred to another signals routing card 42 and/or handler 14. Once in its new location, the display 36 can be reattached using the non-permanent fastener.

Figure 3:
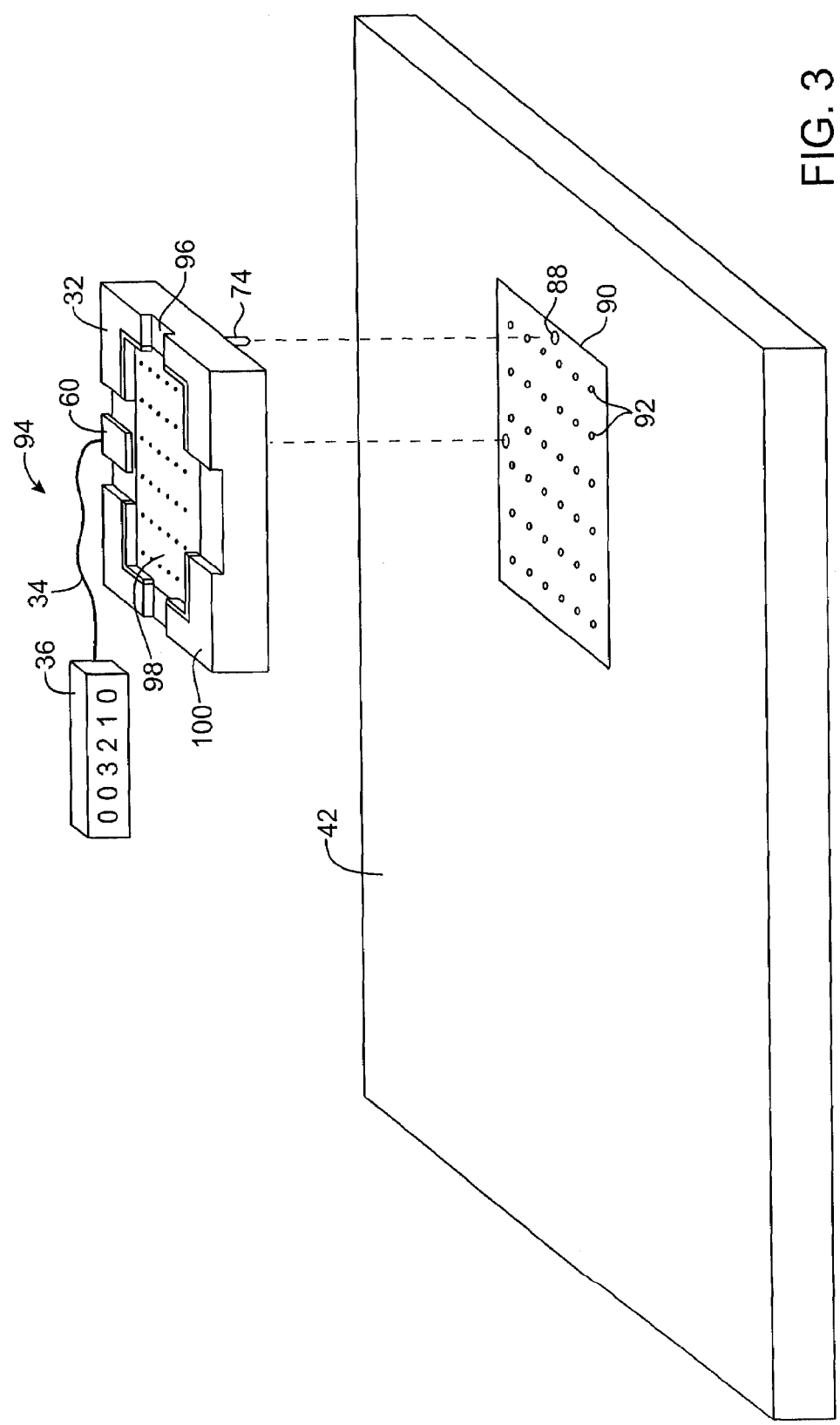
FIG. 3 is an exploded view of a contactor with a touch-down counter and an associated signal routing card for use in an integrated circuit test system in accordance with the present invention.

An exploded perspective view of a touch-down counter 94, contactor 32, and signal routing card 42 is shown in FIG. 3. As shown in FIG. 3, registration pins 74 mate with corresponding holes 88 in signal routing board 42. The touch-down counter 94 preferably includes a display unit 36 such as a display unit having a six-digit liquid crystal diode (LCD) display, a cable 34, and a sensor 60. Other configurations may be used if desired. For example, the display and sensor can be miniaturized so that the touch-down counter can be mounted to the side of the contactor 32 without using cable 34 or using a short cable 34.

The contactor 32 has an array of contact holes 96 on its upper surface. With one suitable arrangement, the floating plate inner portion 98 of contactor 32 reciprocates up and down within the outer portion 100 of contactor 32. When the inner portion 98 is raised, as shown in FIG. 3, the pins within contactor 32 are retracted and are not visible. When the inner portion 98 is pressed downwards as the integrated circuit is pressed against the contactor by the work press, the upper tips of the pins protrude through holes 96 and contact corresponding contact pads on the integrated circuit package. The lower tips of the pins protrude through the lower surface of the contactor and press against an array of contact pads 92 on the signal routing card 42. Contact pads 92 are electrically connected to the connectors 64 of signal routing card 42 using circuitry 68 (FIG. 2).

Each set of signal routing card contacts 92 defines a contactor footprint 90. To ensure that contactors have maximum utility, most contactors are fabricated according to standards promulgated by standards organizations such as the Joint Electron Device Engineering Council (JEDEC). When a standardized contactor footprint is used, it becomes possible to transfer a given contactor between multiple signal routing boards to accommodate different desired testing configurations. Contactors tend to be expensive, so the ability to share a single contactor between multiple signal routing boards in this way reduces testing expenses.

Figure 4:
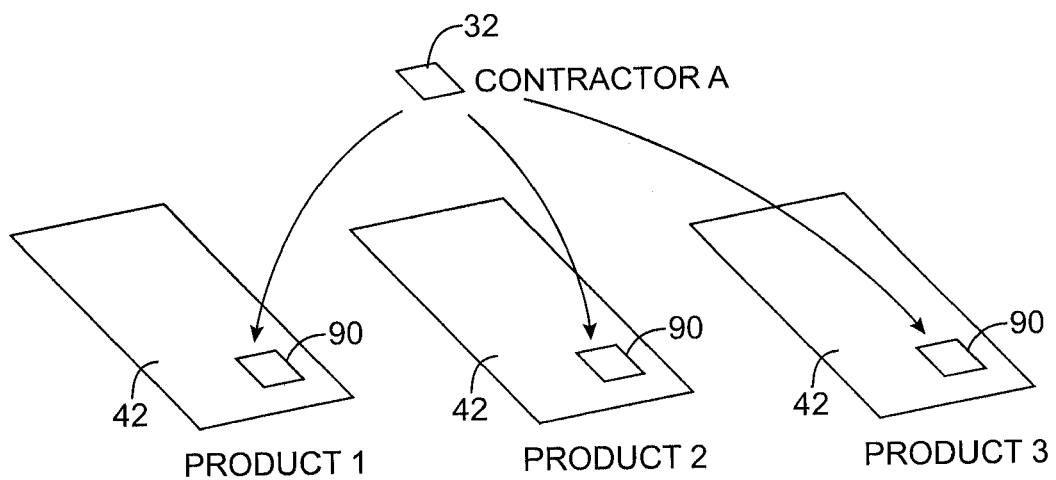
FIGS. 4 and 5 are diagrams showing how a first contactor may be shared between three different signal routing cards to test three different types of integrated circuits, while a second contactor may be shared between two different signal routing cards to test two other types of integrated circuits in accordance with the present invention.
Figure 5:
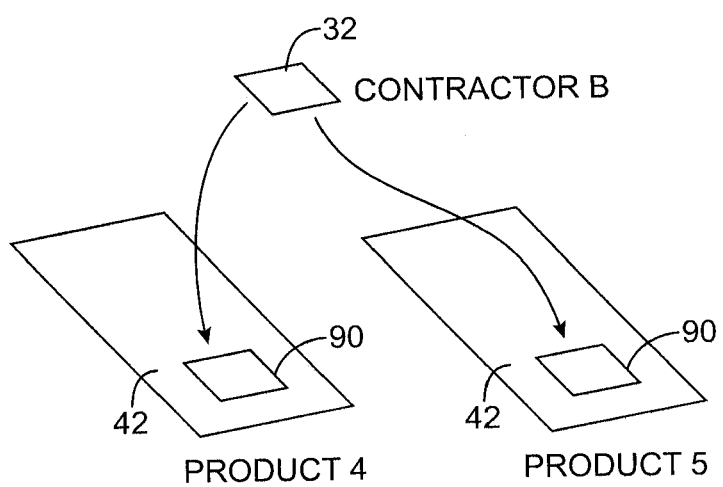

A typical contactor sharing arrangement is shown in FIGS. 4 and 5. As shown in FIG. 4, a first contactor 32 (contactor A) has a footprint that matches the footprint 90 on three different signal routing cards 42. In this example, each signal routing card is used to perform tests for a different integrated circuit product. Unpackaged integrated circuits for each product may have different input-output pad arrangement, but after packaging, the integrated circuits for each of these products has a contact pad pattern that matches the array of holes 96 on the upper surface of contactor A. The lower surface of contactor A is configured to match the footprint 90 on each of the three signal routing cards 42 shown in FIG. 4.

As shown in FIG. 5, a second contactor 32 (contactor B) has a footprint that matches the footprint 90 on two other signal routing cards 42. One of the FIG. 5 signal routing cards is used to test integrated circuits associated with product 4. The other signal routing card in FIG. 5 is used to test integrated circuits associated with product 5.

The examples of FIGS. 4 and 5 demonstrate how a given contactor may be shared between multiple signal routing cards sharing the same footprint (e.g., the same JEDEC footprint). During the lifetime of a contactor, the contactor may be used in many different testing environments. The contactor may, for example, be transferred between signal routing cards 42 in a test facility. If desired, a contactor may be transferred between different testing sites. As an example, a contactor may be moved from a signal routing card in one country to a signal routing card in another country in connection with a transition from preproduction testing to production testing. Contactors may be transferred between testing sites and testing organizations multiple times during their lifetimes.

To keep track of contactor touch-down events in environments in which a contactor may be transferred between different signal routing cards and organizations, the contactor touch-down counter is preferably permanently attached to the contactor 32. For example, as shown in FIG. 3, the contactor touch-down counter 94 may be affixed to contactor 32 by virtue of the permanent attachment of sensor 60 to contactor 32. Sensor 60 may, as an example, be glued to contactor 32 using cyanoacrylate glue or other suitable adhesive. Display unit 36 and cable 34 are connected to sensor 60, so whenever contactor 32 is transferred to a new location, the entire contactor touch-down counter 94 remains intact and accompanies the contactor 32. Counter 94 is preferably battery powered using a battery, so that counter 94 provides an automatic lifetime record of touch-down events for the contactor.

Figure 6:
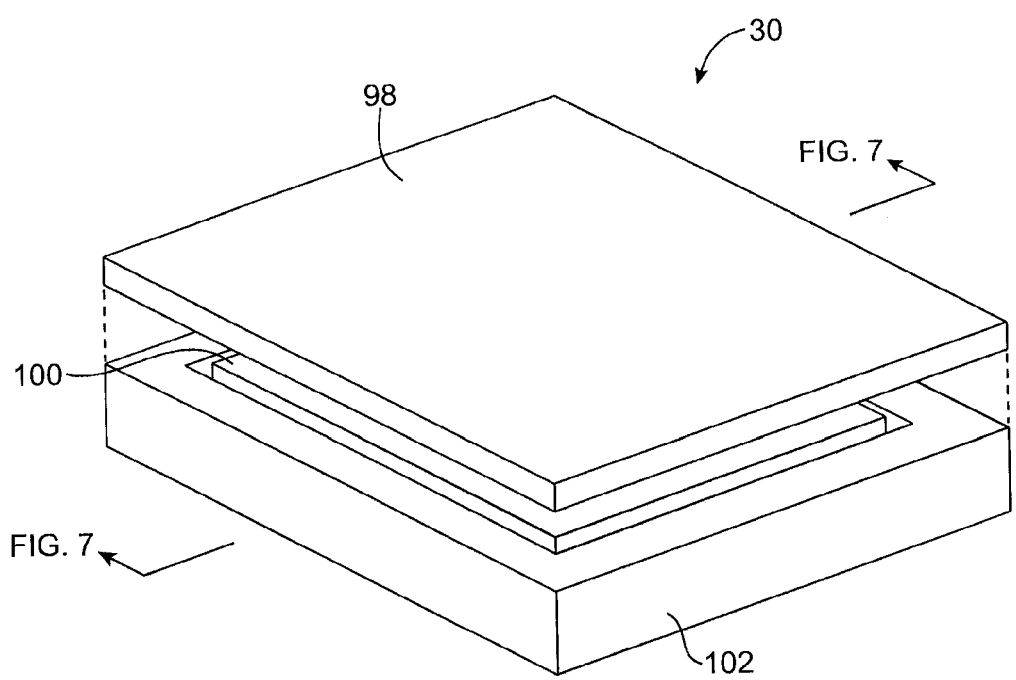
FIG. 6 is a perspective exploded view of an illustrative packaged integrated circuit that may be tested using a test system of the type shown in FIG. 1 in accordance with the present invention.

Contactor 32 may be used to test integrated circuits packaged in any suitable type of package. A partly-exploded perspective view of an illustrative flip-chip ball-grid-array integrated circuit package arrangement is shown in FIG. 6. As shown in FIG. 6, packaged integrated circuit 30 is formed by placing integrated circuit die 100 in a flip-chip ball-grid-array package 102. Die 100 is placed with its upper side facing down to form electrical connections with contacts on package 102. After mounting in ball-grid-array package 102, a heat sink 98 is attached to the top of package 102.

Figure 7:
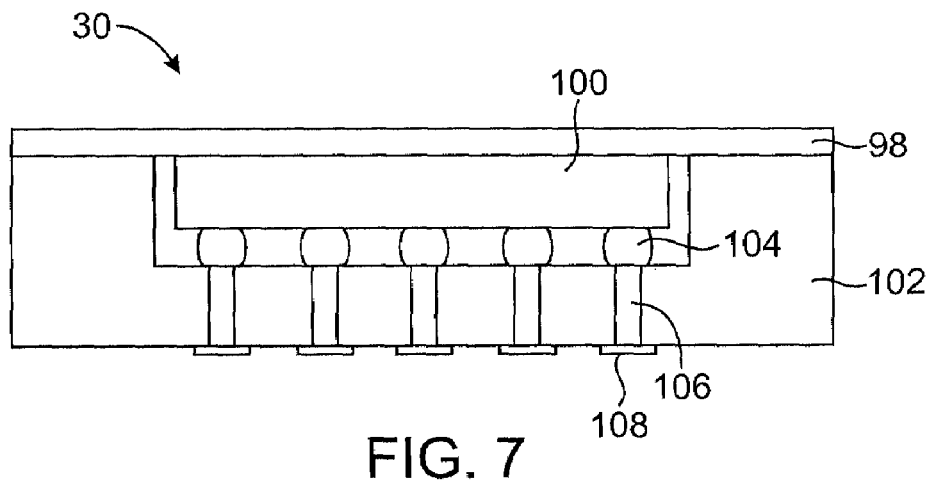
FIG. 7 is a side view of an illustrative packaged integrated circuit of the type shown in FIG. 6, which uses a flip-chip ball grid array (BGA) packaging arrangement in accordance with the present invention.

A cross-sectional side view of the packaged integrated circuit 30 of FIG. 6 is shown in FIG. 7. As shown in FIG. 7, integrated circuit die 100 is connected to electrical contacts 106 of package 102 by solder balls 104. The lower portions 108 of package 102 form an array of contacts that match the array of holes 96 on the upper surface of contactor 32 (FIG. 3).

Figure 8:
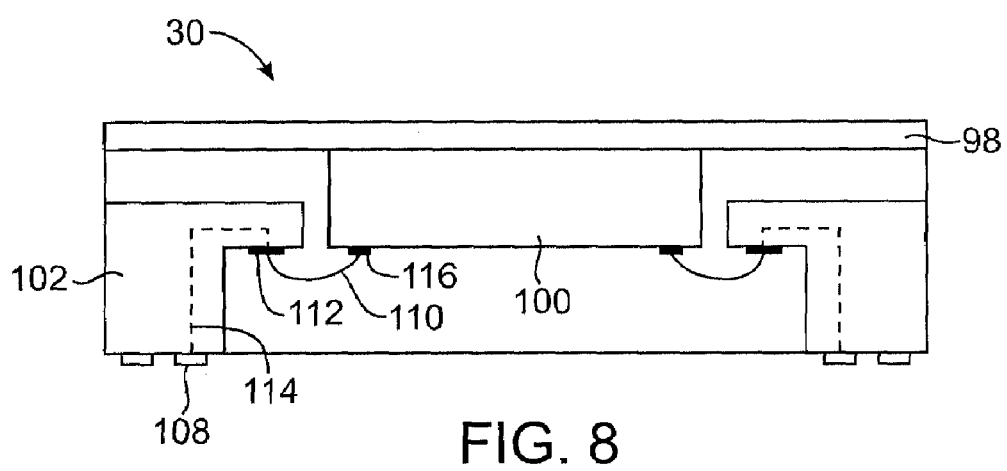
FIG. 8 is a side view of an illustrative packaged integrated circuit using a die-down wire-bonded ball grid array (BGA) packaging arrangement in accordance with the present invention.

Another suitable integrated circuit packaging arrangement is shown in FIG. 8. The arrangement of FIG. 8 is a so-called die-down arrangement. Integrated circuit die 100 is attached to heat sink 98 with its upper face facing downward. Wire bonds 110 are used to connect contacts 116 on integrated circuit 100 to pads 112. Routing paths shown by dotted lines 114 are used to connect pads 112 to contacts 108. Contacts 108 are formed in a pattern that matches the holes 96 on the upper surface of a corresponding contactor 32.

Figure 9:
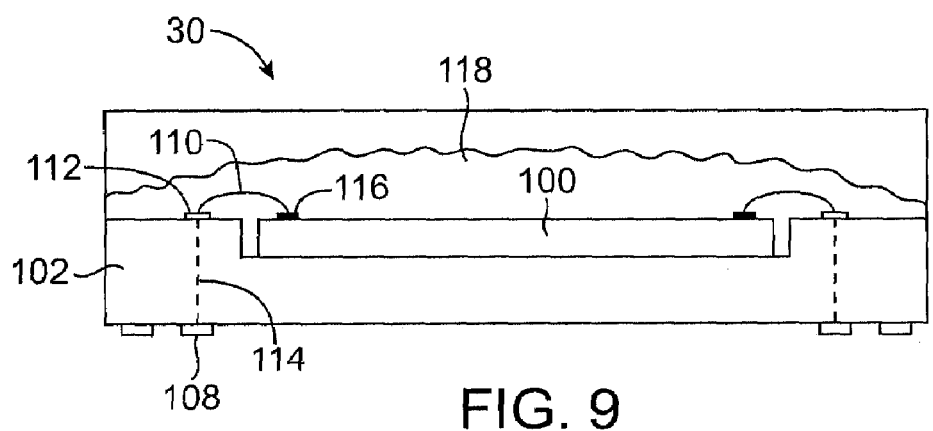
FIG. 9 is a side view of an illustrative packaged integrated circuit using a die-up wire-bonded ball grid array (BGA) packaging arrangement in accordance with the present invention.

In the illustrative integrated circuit packaging arrangement of FIG. 9, the integrated circuit die 100 is mounted in package 102 in a "die-up" configuration. Wire bonds 110 are used to connect the contacts 116 of integrated circuit die 100 to contacts 112 on package 102. Signal routing paths 114 electrically connect contacts 112 and contacts 108 on the lower surface of the package 102. After wire bonding is complete, encapsulant 118 is placed over the top of die 100.

Regardless of the type of integrated circuit packing arrangement that is used to form the packaged integrated circuit, the packaged integrated circuit preferably has a pattern of contacts on its lower surface that mate with a corresponding array of pins in contactor 32.

Figure 10:
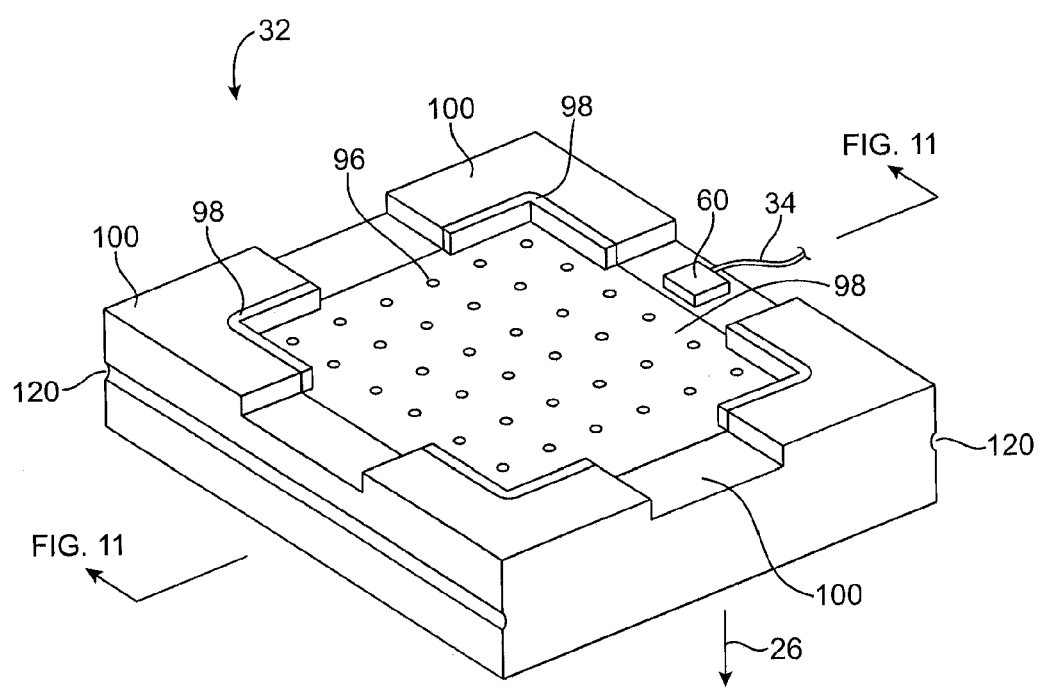
FIG. 10 is a perspective view of an illustrative contactor with a touch-down sensor in accordance with the present invention.

An illustrative contactor 32 is shown in FIG. 10. As shown in FIG. 10, contactor 32 has an array of holes 96, which define the locations of pins. Contactor 32 has a floating plate inner portion 98 and an outer portion 100. When no downward pressure is placed on inner portion 98, the surface of inner portion 98 is flush with part of the outer portion 100, as shown in FIG. 10.

The pins in the contactor are aligned with holes 96. When the inner portion 98 of contactor 32 is in the position shown in FIG. 10, the pins remain below the upper edges of holes 96 and are not visible. The inner dimensions of inner portion 98 form a guide for a packaged integrated circuit 30. When work press 86 presses a packaged integrated circuit 30 downward into inner portion 98, the inner portion 98 moves downward on springs in direction 26. This allows the pins beneath holes 96 to protrude upward through the holes 96 to touch the contacts 108 on the lower surface of the packaged integrated circuit. If desired, contactor 32 may have grooves 120 that accommodate manually-actuated work press fixtures.

Figure 11:
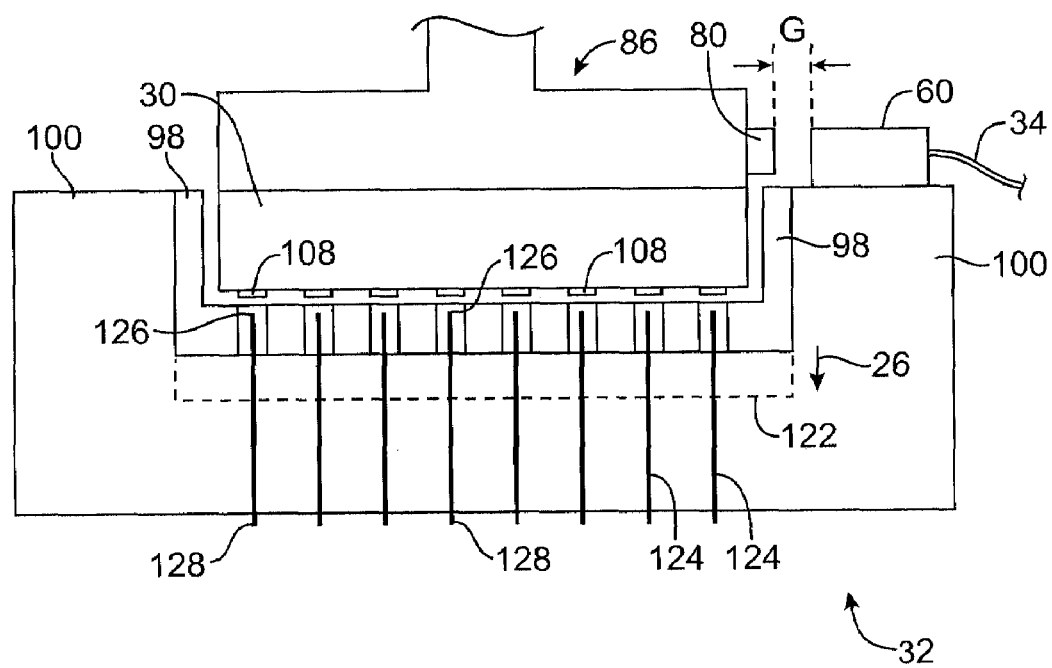
FIG. 11 is cross-sectional side view of an illustrative work press placing an integrated circuit in contact with a contactor having a touch-down sensor in accordance with the present invention.

A cross-sectional side view of the contactor 32 of FIG. 10 is shown in FIG. 11. In the configuration shown in FIG. 11, work press 86 is beginning to press a packaged integrated circuit 30 downward in direction 26, but has not yet depressed inner portion 98 of contactor 32 relative to outer portion 100. As a result, the upper ends 126 of pins 124 have not yet touched contacts 108. The lower ends 128 of pins 124 protrude from the bottom of contactor 32. When contactor 32 is mounted to signal routing card 42, pin ends 128 come into electrical contact with matching contact pads 92, as described in connection with FIG. 3.

The side view of FIG. 11 shows the minimum gap G that is attained between Hall-effect sensor 60 and magnet 80. The gap G is less than the sensor range (e.g., less than 200 mils for an illustrative Hall-effect sensor). As work press 86 is moved down and past sensor 60, magnet 80 becomes close enough to sensor 60 that sensor 60 detects the presence of magnet 80. In response, the touch-down counter increments its count to reflect that the integrated circuit 30 has touched down on pins 124.

Figure 12:
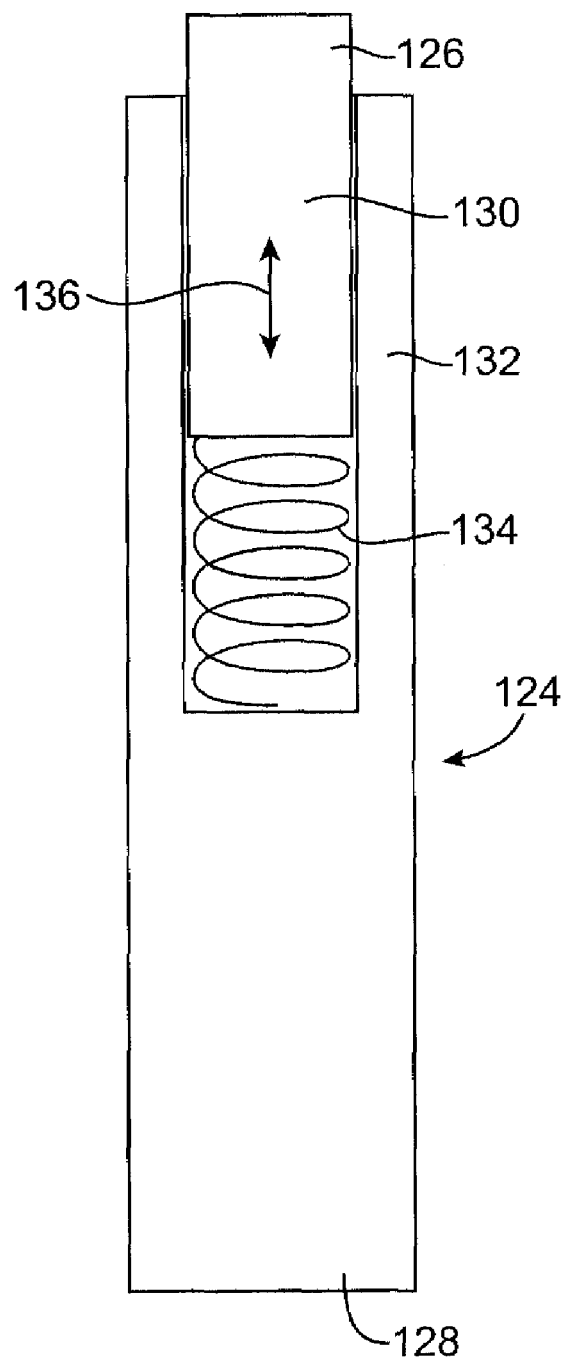
FIG. 12 is a cross-sectional view of an illustrative pogo pin used in a contactor in accordance with the present invention.

When pins 124 are contacted, they are compressed by the work press 86. This ensures that satisfactory low-resistance electrical contacts are formed between upper pin ends 126 and integrated circuit package contacts 108. A cross-section of an illustrative pin 124 is shown in FIG. 12. As shown in FIG. 12, pin 124 may have a spring 134 which bias pin portion 130 in the upwards direction. Pin portion 130 reciprocates in directions 136 within the sheath formed by pin portion 132. This type of pin is sometimes referred to as a pogo pin and requires periodic maintenance (e.g., cleaning) to perform properly. By using counter 94 to measure the number of times pins 124 are compressed during testing, it is possible to schedule maintenance for pins 124. Maintenance may, for example, be scheduled every 10,000 touch-downs, every 15,000 touch-downs, or at any other suitable interval.

Figure 13:
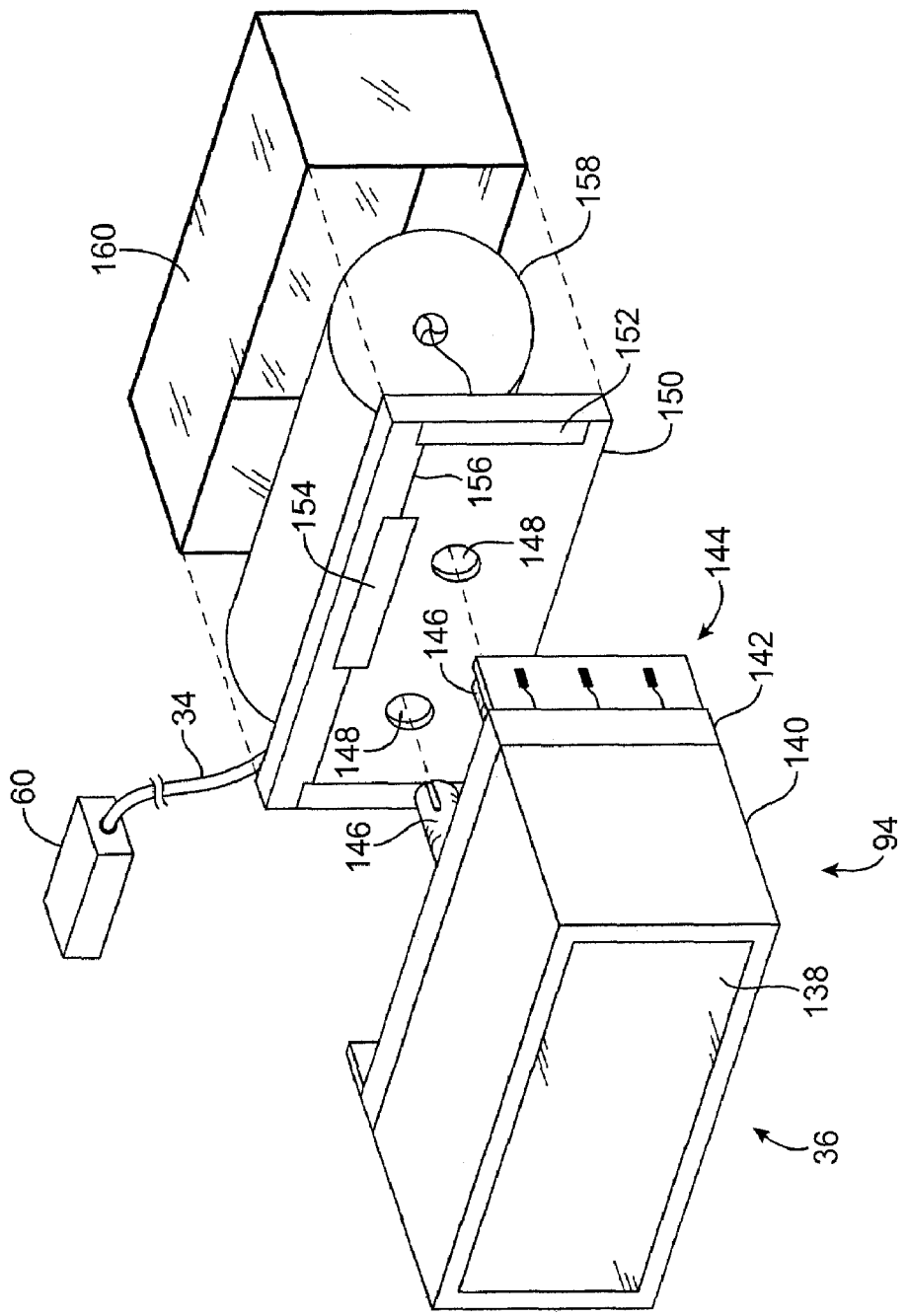
FIG. 13 is an exploded perspective view of a illustrative contactor touch-down counter in accordance with the present invention.

An exploded perspective view of an illustrative counter 94 is shown in FIG. 13. As shown in FIG. 13, counter 94 has a sensor 60 and a cable 34. Counter display unit 36 has a display 138 such as a liquid crystal display mounted in a display housing 140. Display driver circuitry and counter control circuitry can be provided on board 142 (as an example). Contacts 144 may be used to electrically connect the circuitry of board 142 to sensor interface board 150. Board 150 may be, for example, a Hall-effect sensor interface that receives Hall-effect signals from sensor 60 over cable 34.

Plastic pins 146 may be used to physically attach board 150 to board 142. When attached, the contacts that are shown schematically as contacts 152 on board 150 form electrical connections with contacts 144. This interconnects the electronics 154 and traces 156 on board 150 and the circuitry on board 142.

Counter 94 may be powered by a battery 158. Battery 158 and the other components of counter 94 may be mounted in a housing 160. To minimize the need for battery replacement, battery 158 may be a high-capacity battery such as a lithium battery. Battery life can also be extended by using low current circuits in circuitry 142 and circuitry 150. With one suitable arrangement, sensor interface circuitry 150 is a custom-designed circuit board and board 142 and the other portions of display unit 36 are a commercially available integrated display and counter circuit such as counter Part No. SUB-CUB1, available from Red Lion Controls of York, Pa. Counter Part No. SUB-CUB1 operates over a voltage range of 2.5 volts to 6 volts, which is compatible with lithium battery power and exhibits a current draw of less than 10 micro amps.

Figure 14:
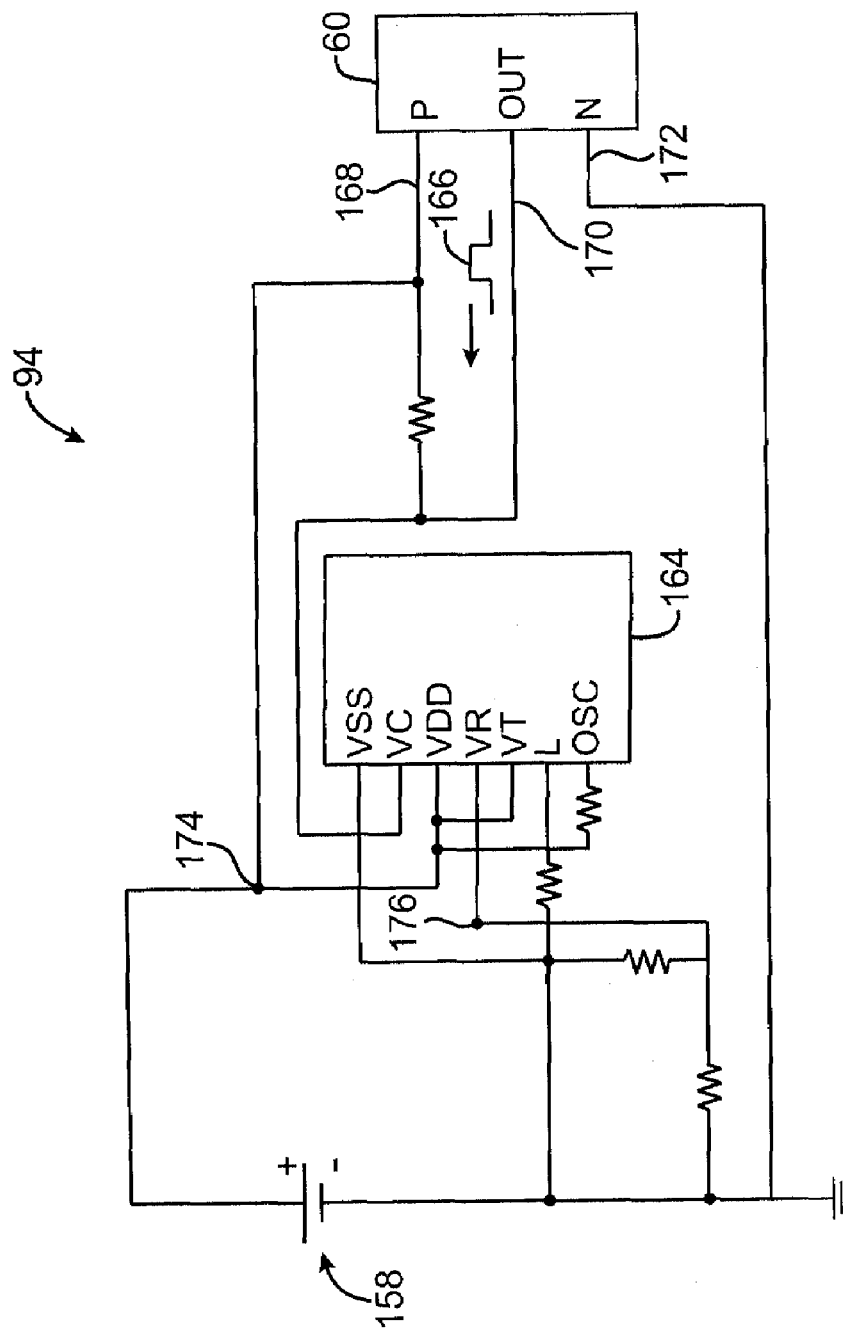
FIG. 14 is a circuit diagram of an illustrative contactor touch-down counter in accordance with the present invention.

A circuit diagram of an illustrative counter 94 is shown in FIG. 14. Component 164 is an integrated display and counter such as Part No. SUB-CUB1 from Red Lion Controls. Component 60 is a Hall-Effect sensor such as Part No. A3212 from Allegro Microsystems. Cable 32 is formed from paths such as paths 168, 170, and 172, which are connected to sensor 60 at terminals P, OUT, and N. The remainder of the circuitry of FIG. 14 forms a bias network that biases circuit 164 for operation.

Terminal P of sensor 60 is a positive power supply terminal and is connected to the positive terminal of battery 158. Terminal N is the ground terminal of sensor 60 and is connected to the ground terminal of battery 158. Sensor 60 produces output pulses on line 170 such as pulse 166. These pulses are conveyed to the Vc input of counter 164. Each time a pulse 166 is received at the input of counter 164, the count that is being maintained by counter 164 is incremented by one unit. The digits displayed on the liquid crystal display 138 (FIG. 13) by the counter are also incremented by one. The counter may be reset to zero by applying a positive pulse to the Vr terminal (e.g., by manually shorting nodes 174 and 176 using the tip of a screwdriver).

Figure 15:
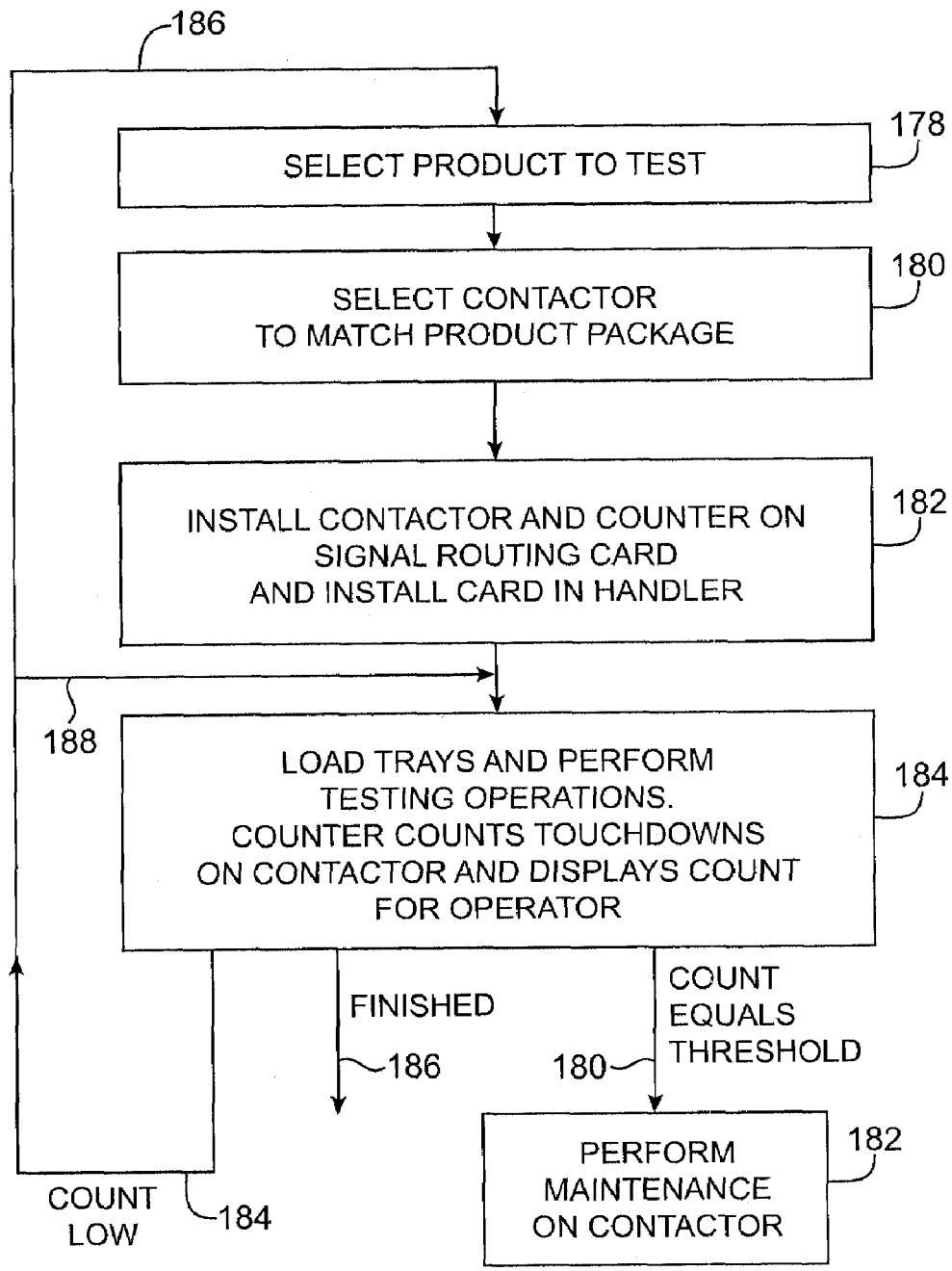
FIG. 15 is a flow chart of illustrative steps involved in using a contactor touch-down counter while performing testing operations in accordance with the present invention.

Illustrative steps involved in using counter 94 to maintain an automatic record of contactor touch-down events for a given contactor 32 are shown in FIG. 15.

At step 178, a product is selected for testing. Different products are packaged in integrated circuit packages having different footprints.

At step 180, an appropriate contactor 32 is selected that has a pattern of holes 96 and pogo pins 124 that match the pattern of contacts 108 on the bottom of the integrated circuit 30. The selected contactor is obtained and prepared for use. If desired, the contactor 32 may be obtained from a remote location (e.g., from another organization in another country). During the transfer process, the count stored on the counter 94 is not disrupted, because the counter 94 is battery powered and is attached to the contactor.

At step 182, the contactor 32 is installed on a signal routing card 42. The counter 94 is attached to the contactor 32, so the contactor 32 and counter 94 are attached together to the signal routing card. The signal routing card is installed in an appropriate test handler 14.

At step 184, a test system operator loads trays of integrated circuits into the test handler 14. The test handler uses its work press 86 to place the integrated circuits into contact with the pogo pins of the contactor 32. Each time the work press places another integrated circuit 30 into contact with the pogo pins, the work press and magnet 80 move into the vicinity of the sensor 60. The sensor 60 generates a touch-down count pulse in response to each contact event, which increments the counter 94. As the count is incremented, the total count is displayed on the display of the counter, so that it may be observed by the test system operator.

If the touchdown count remains below a suggested maintenance threshold count and testing has been completed, testing operations are finished, as shown by line 186.

If, however, the system operator observes that the count of the counter has exceeded the suggested maintenance threshold count value, the contactor 32 can be removed from service for maintenance (step 182). If desired, an alarm circuit can be provided in counter 94. The operator can set the maintenance count threshold. When the count threshold has been exceeded, the alarm can be triggered automatically to warn the operator.

If the touchdown count remains below the maintenance threshold and more tests need to be performed, processing can loop back to earlier steps, as indicated by line 184. For example, the same contactor, handler, and signal routing board 42 may be used to test additional trays of integrated circuits (line 188). The counter can also be transferred to another locations or attached to another signal routing card 42 before additional testing is performed (line 186).

Figure 16:
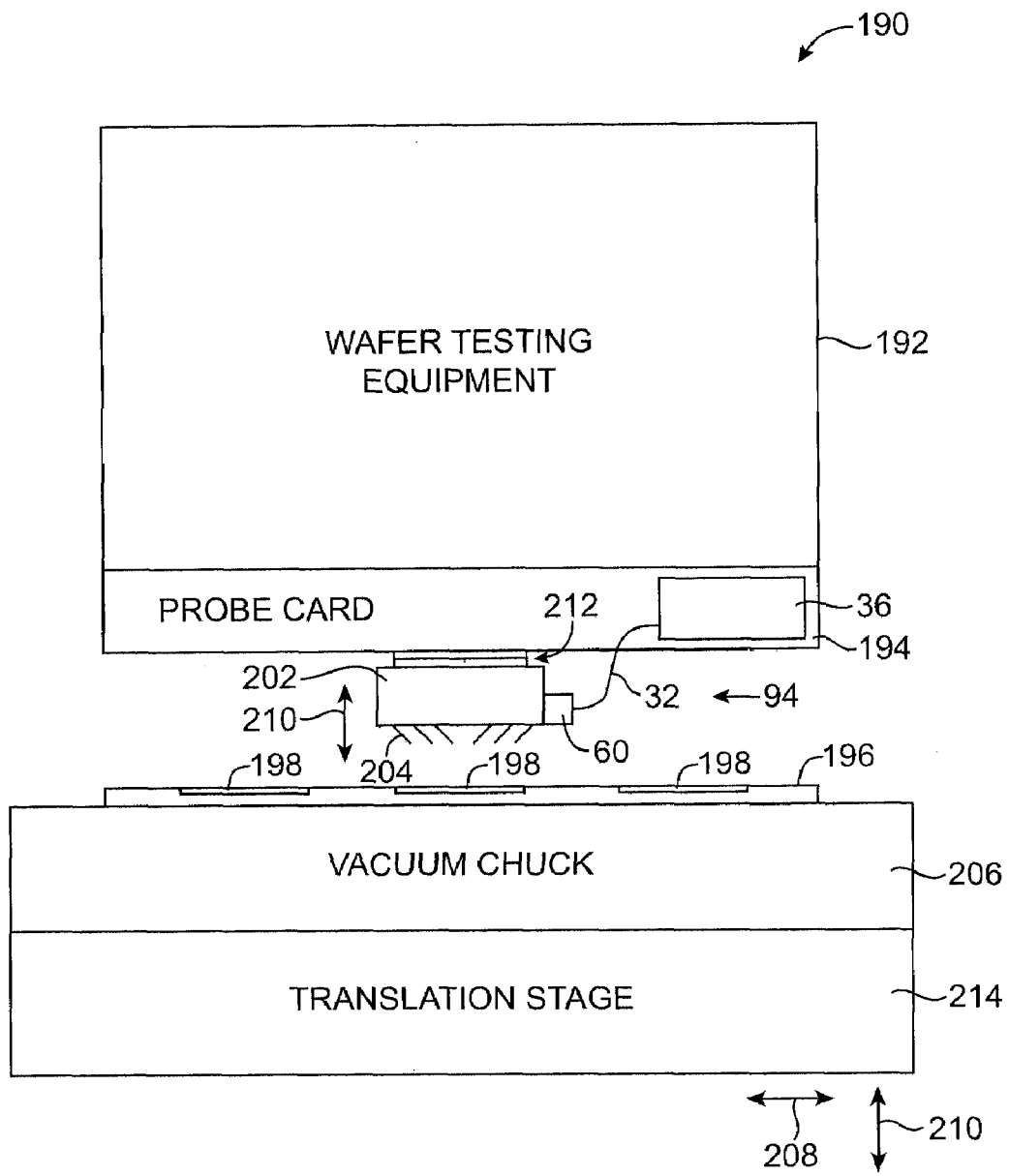
FIG. 16 is a diagram showing the use of a contactor touch-down counter in a wafer-level testing system in accordance with the present invention.

If desired, the counter 94 may be used to count touchdown events associated with the testing of integrated circuits while they are in wafer form. A typical wafer testing system 190 is shown in FIG. 16. Wafer testing system 190 may be used, for example, in an initial wafer sort testing phase in which it is desired to categorize integrated circuits as being good, as being defective but reparable, or as being bad (not reparable). Wafer 196 is >mounted to a translation stage 214 by a vacuum chuck 206. Stage 214 can move wafer 196 up and down in directions 210 and can translate wafer 196 in directions 208. Stage 214 preferably can be rotated to remove angular misalignment of wafer 196. The process of aligning wafer 196 after wafer 196 has been mounted in chuck 206 may be performed automatically using a machine vision system (not shown).

The wafer 196 contains an array of integrated circuits 198. Tests are performed by raising the wafer 196 so that the contact pads of a given integrated circuit 196 form electrical contacts with an array of test pins 204 in probe head 202. Probe heads are connected to probe cards using connectors 212, so it a given probe head may be used on various different probe cards 194 and pieces of wafer testing equipment 192 during its lifetime. Probe head 202 gathers test signals through test pins 204 and provides the test signals to probe card 194 for analysis by wafer test equipment 192.

As shown in FIG. 16, counter 94 preferably has a sensor 60 mounted to the probe head 202. Sensor 60 may be, for example, a capacitive proximity sensor that senses when probe head 202 is close to wafer 196 and stage 214. Each time a test is performed, the pins 204 touch down on the contact pads of an integrated circuit 198. The sensor 60 of the counter detects the movement of the probe head and increments the counter. The updated counter value is displayed on display 36. Display 36 may be attached to the wafer testing equipment 192 in a location that is visible to the operator of the test system (e.g., using a non-permanent fastening arrangement such as a hook-and-loop fastener). Whenever the test system operator observes that the number of test pin touch downs on the wafer 196 has exceeded a recommended maintenance threshold value, the test pins 204 and probe head 202 may be cleaned or provided with other appropriate maintenance.

The foregoing is merely illustrative of the principles of this invention and various modifications can be made by those skilled in the art without departing from the scope and spirit of the invention.

What is claimed is:

1. A touch-down counter that counts how many times a contactor in a test system is contacted by integrated circuits, comprising:

a sensor that detects each time the contactor is touched by an integrated circuit and that provides corresponding sensor signals; and circuitry that receives the sensor signals from the sensor and that increments a contactor touch-down count value each time the contactor is touched.

2. The touch-down counter defined in claim 1 further comprising a display on which the count value is displayed.

3. The touch-down counter defined in claim 1 further comprising a liquid crystal diode display on which the count value is displayed.

4. The touch-down counter defined in claim 1 further comprising a cable that conveys the sensor signals from the sensor to the circuitry.

5. The touch-down counter defined in claim 1 further comprising a lithium battery that supplies power to the sensor and circuitry.

6. The touch-down counter defined in claim 1 wherein the sensor comprises a non-contact sensor.

7. The touch-down counter defined in claim 1 wherein the sensor comprises a Hall-effect sensor.

8. The touch-down counter defined in claim 1 wherein the sensor comprises a Hall-effect sensor that detects when the contactor is touched by the integrated circuit by detecting the presence of a magnet attached to a work press in the test system.

9. The touch-down counter defined in claim 1 wherein the sensor is permanently attached to the contactor, the touch-down counter further comprising a cable that conveys the sensor signals from the sensor to the circuitry.

10. The touch-down counter defined in claim 1 wherein the sensor is permanently attached to the contactor, the touch-down counter further comprising:

a cable that conveys the sensor signals from the sensor to the circuitry; and a display that is non-permanently attached to a test handler in the test system, wherein the count value is displayed on the display.

11. The touch-down counter defined in claim 1 further comprising:

a cable, wherein the sensor comprises a first terminal that receives a positive power supply voltage over the cable, a second terminal that supplies the sensor signals to the circuitry over the cable, and a third terminal that receives a ground power supply voltage over the cable; and a display that is attached to a test handler in the test system using a hook-and-loop fastener, wherein the count value is displayed on the display.

12. A touch-down counter that counts how many times an array of test pins in a test system is contacted by integrated circuits, comprising:

a sensor that detects each time the array of test pins is touched by an integrated circuit and that provides corresponding sensor signals;

a cable;

a display; and circuitry that receives the sensor signals from the sensor over the cable, wherein, in response to the received signals, the circuitry increments a touch-down count value each time the array of test pins is touched, and wherein the circuitry displays the touch-down count value on the display.

13. The touch-down counter defined in claim 12 wherein the array of test pins comprises pins connected to a probe card in a wafer testing system and wherein the sensor comprises a capacitive proximity sensor that detects when the array of pins touches the wafer.

14. The touch-down counter defined in claim 12 further comprising a battery that powers the circuitry.

15. The touch-down counter defined in claim 12 wherein the test system includes a test handler in which a contactor containing the array of test pins is used to test the integrated circuits, the touch-down counter further comprising a non-permanent fastener that attaches at least the display to the test handler.

16. The touch-down counter defined in claim 12 wherein the test system includes a test handler having a work press that places the integrated circuits in contact with a contactor containing the array of test pins, wherein a magnet is attached to the work press, and wherein the sensor comprises a Hall-effect sensor that detects when the contactor is touched by detecting the presence of the magnet attached to the work press.

* * * * *